US006965897B1

(12) United States Patent
Chen

(10) Patent No.: US 6,965,897 B1
(45) Date of Patent: Nov. 15, 2005

(54) DATA COMPRESSION METHOD AND APPARATUS

(75) Inventor: Zewei Chen, Chatham, NJ (US)

(73) Assignee: AT&T Corp., New York, NY (US)

( * ) Notice: Subject to any disclaimer, the term of this patent is extended or adjusted under 35 U.S.C. 154(b) by 289 days.

(21) Appl. No.: 10/065,513

(22) Filed: Oct. 25, 2002

(51) Int. Cl.[7] .............................................. G06F 17/30
(52) U.S. Cl. ...................... 707/100; 707/101; 707/102; 707/103 R; 707/104.1
(58) Field of Search ............................... 707/101, 6, 2, 707/102, 3, 103 R, 100, 104.1; 379/242; 717/176; 83/56; 341/67

(56) References Cited

U.S. PATENT DOCUMENTS

| | | | | |
|---|---|---|---|---|
| 3,643,226 | A * | 2/1972 | Loizides et al. | 707/3 |
| 4,667,550 | A * | 5/1987 | Eiting | 83/56 |
| 5,426,779 | A * | 6/1995 | Chambers, IV | 707/6 |
| 5,774,715 | A * | 6/1998 | Madany et al. | 707/101 |
| 5,878,125 | A * | 3/1999 | Ginzboorg | 379/242 |
| 6,381,742 | B2 * | 4/2002 | Forbes et al. | 717/176 |
| 6,654,734 | B1 * | 11/2003 | Mani et al. | 707/2 |
| 6,771,193 | B2 * | 8/2004 | Craft | 341/67 |
| 2003/0009474 | A1 * | 1/2003 | Hyland et al. | 707/102 |

FOREIGN PATENT DOCUMENTS

| | | | | |
|---|---|---|---|---|
| EP | 000520117 A1 * | 12/1992 | | H04L 29/06 |
| EP | 000798656 A2 * | 10/1997 | | G06F 17/30 |
| WO | WO000070770 A1 * | 11/2000 | | H04L 29/06 |
| WO | WO000163852 A1 * | 8/2001 | | H04L 12/56 |

* cited by examiner

*Primary Examiner*—Frantz Coby

(57) ABSTRACT

An improved data compression method and apparatus is disclosed, particularly for compressing large database tables. A data structure is disclosed which is fully compatible with the traditional DBMS demands, including the random access requirement of RDBMS. The data structure is built on a mixed format physical layout comprising of fixed-sized fields and variable-sized fields which are compressed depending on the size and frequency of the fields. An improved compression ratio is achieved by exploiting redundancy in the mixed format physical layout to encode the column-wise redundancy in the data itself and the correlations among columns. The present invention provides a very fast random access decompression and enables not only greater compression ratios, but also permits flexibility of choosing from a number of compression algorithms.

29 Claims, 5 Drawing Sheets

DATA COMPRESSION METHOD AND APPARATUS

BACKGROUND OF INVENTION

The present invention relates to data compression systems and methods, and more specifically, to data compression with random access.

Compression of large databases not only reduces disk storage, it can also speed up query answering by reducing the bulk that has to be pushed through the increasingly narrow (relative to CPU speed) disk I/O bottleneck. Various techniques for compressing data are commonly used in the communications and computer fields.

The prior art in database compression falls roughly into two major categories; Record Level Compression and Block Level or File Level Compression. Record Level Compression is less accurate and has a low compression ratio, but generally is much faster in compression processing. Also, Record Level Compression techniques yield a greater degree of data compression. Block Level Compression, for example, variants of LZ77 & LZW algorithms are very accurate and have higher compression ratios, but are much slower in compression processing. Unfortunately, the prior methods of data compression are less favorable for database-like applications, which generally require random access to data. So, a need exists for a more effective and efficient compression technique which is suitable for this class of applications, which is presented in this invention in the manner described below.

SUMMARY OF INVENTION

The present invention provides a new improved method for compressing large database tables, more particularly for data compression with random access. The present invention discloses a data structure and a decompression method and a number of compression methods. The chief virtues of our data structure is that it is fully compatible with the traditional DBMS demands, including the random access requirement of RDBMS. The data structure is built on a mixed format physical layout comprising fixed-sized fields and variable-sized fields which are compressed depending on the size and frequency of the fields. An improved compression ratio is achieved by exploiting redundancy in the mixed format physical layout to encode the column-wise redundancy in the data itself and the correlations among columns. The present invention provides a very fast random access decompression and enables not only greater compression ratios, but also permits flexibility of choosing from a number of compression algorithms.

DETAILED DESCRIPTION

Figure 1:
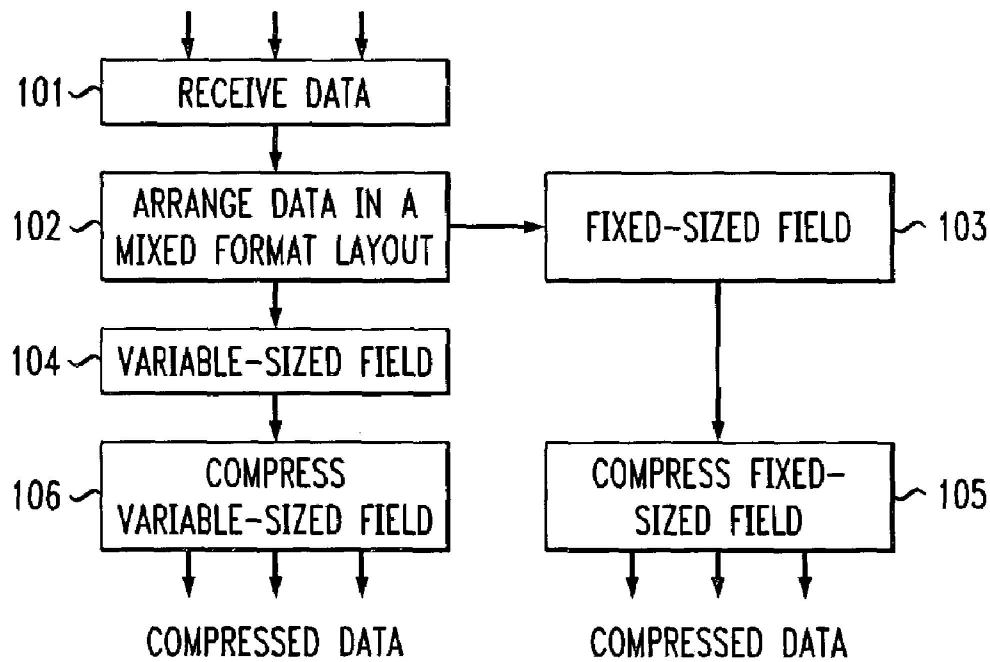
FIG. 1 is a flow chart illustrating a method for compressing large database tables.
Figure 2:
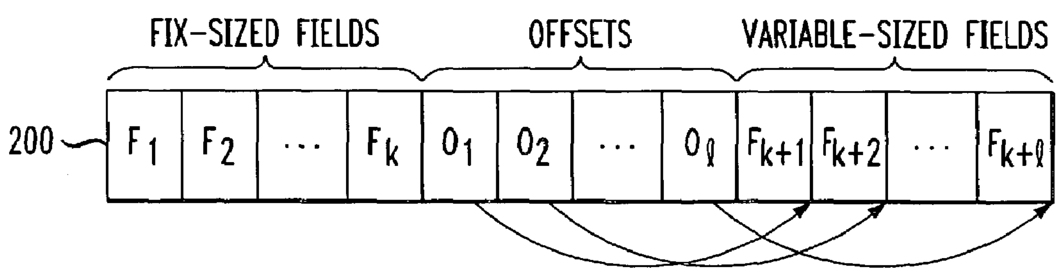
FIG. 2 illustrates a mixed format physical layout of a compression data structure.

FIG. 1 is a flow diagram illustrating a routine for compressing large database tables in accordance with an embodiment of the invention. The data is received at step 101. The data received can be an arbitrary sequence of characters. The data received can consist of letters, for example an employee's name, title etc., the data can be numerical such as an employee's social security number, employee id etc. and the data can be combination of both letters and numbers. At step 102, the data is arranged in a mixed format layout, which is divided into fixed-sized fields (k), at step 103 and variable-sized fields (1) at step 104. An example of a physical layout of a mixed format is shown in FIG. 2. In FIG. 2, we consider a relation with k fixed-sized fields and I variable-sized fields. The physical layout, 200, in mixed format, of this relation has k+1 fixed fields, (k values and 1 field offsets) in the front of the record and 1 variable fields after. The sizes of the fixed-sized fields and the order of all fields are stored in a data dictionary (not shown), along with such global (common to all records) information such as the types of each field, any integrity constraints, and so on. An example of the type of data or record in the fixed-sized field would be an employee's social security # since the ss# always consists of 9 digits. An example of the type of data or record in the variable-sized field would be employees'name or address, which would vary in digits. Back to FIG. 1, finally at step 105, the data in the fixed-sized fields are compressed, and at step 106, the data in the variable sized fields are compressed. Various compression methods are well-known in the art. For example, a compression technique called Byte Pair Encoding (BPE) is presented by Philip Gage in "A New Algorithm for Data Compression—The C Users Journal, February, 1994". More detailed compression of the data in the fields is described below.

Figure 3:
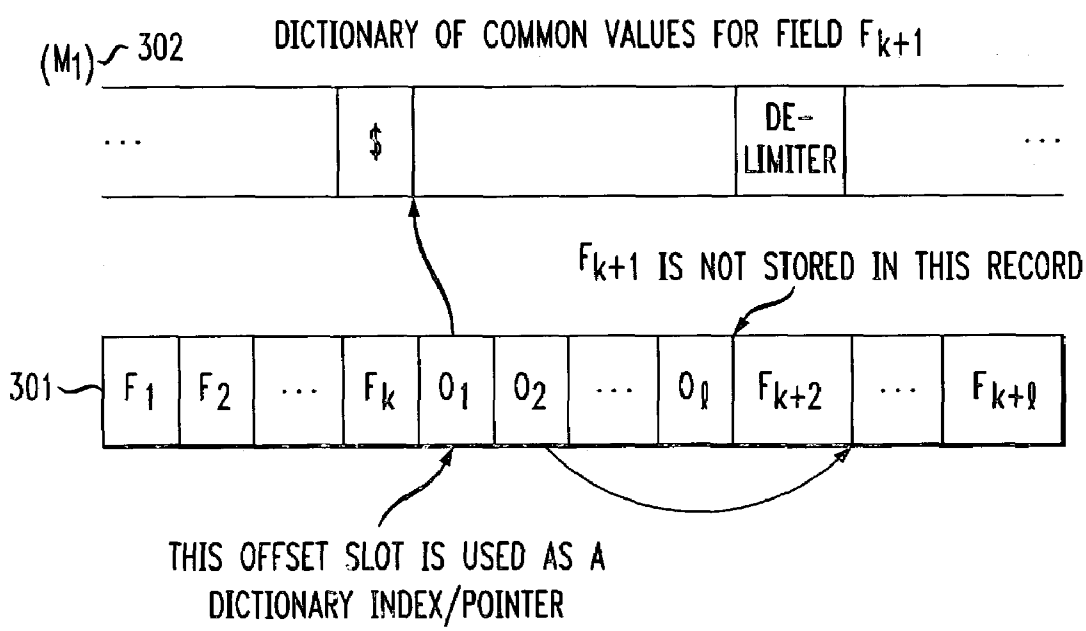
FIG. 3 shows a physical layout for compressing a variable-sized field displaying a variant use of offset slots.
Figure 4:
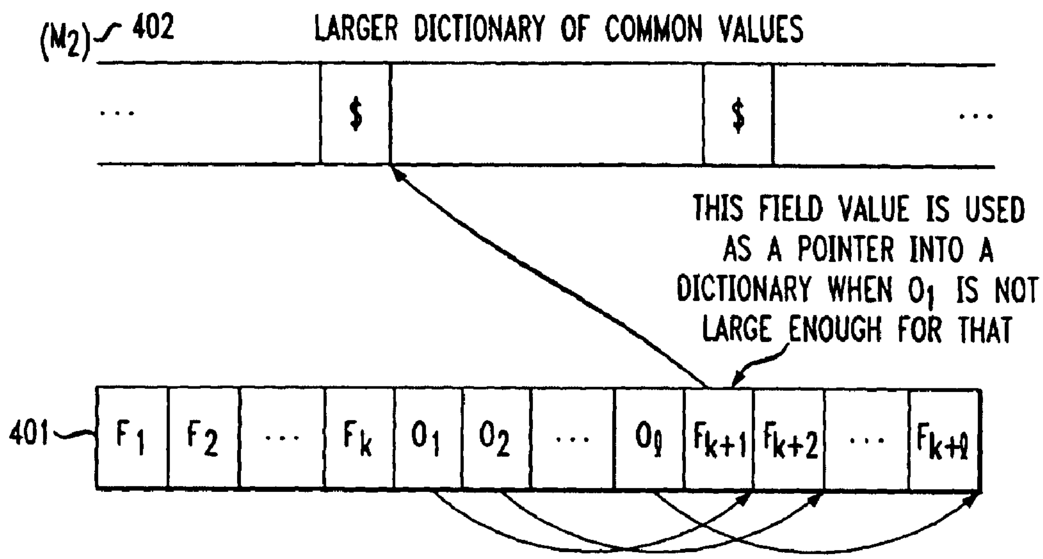
FIG. 4 shows a physical layout for compressing a variable-sized field displaying a variant use of field values for larger dictionaries.

FIGS. 3 and 4 show physical layout for compressing variable-sized fields. FIG. 3 illustrates variant use of the offset slots for compressing variable sized fields. A representative sample of a mixed format layout, 301, is shown in FIG. 3. Data dictionary, 302, contains both the frequency and sizes of the field values. Suppose m1 frequently occurring long values for a column (field) are stored in a data dictionary, 302, by an arbitrary compression algorithm. Now one wishes to encode the values of that field and allow fast decompression. The offset slot for that field can be used, depending on a discriminating bit, either to encode an offset into the record for a non-redundant field value as a pointer into the static dictionary when a field value in a record is redundant. As shown in FIG. 3, for example, the offset slot $O_1$ for the field $F_{k+1}$ is used as a pointer into the dictionary, since the common values for the field $F_{k+1}$ are stored in the dictionary. In this case the field value of $F_{k+1}$ need not be stored in the record at all. On the other hand, the offset slot $O_2$ for the field $F_{k+2}$ is used to encode the offset into the record, since the field value $F_{k+2}$ is a non-redundant field value, and so on. In other words, with regard to the data in the field values which are repetitive and occur frequently, the compression is already done in the data dictionary. Then, it is just a matter of pointing to the compressed data in the dictionary. This allows for fast compression of data and less storage space is needed to store the redundant data. The compression of data in a variable-sized field as shown in FIG. 3 presumes both the data dictionary and the offset value to be of a fixed size. This may raise a question about size. For example, let the size of the offset element be s. Then to address a dictionary of size m1, we must have s−1>log(m1) (remembering the discriminating bit). So an s that is large enough for field offsets might not be big enough to encode a dictionary of the optimal size. Or conversely, if the pointer size is appropriate for a dictionary, it might be wasteful to be used for record offsets. Obviously, a fine-grained optimality is not easy to achieve here. However, it is possible to code in a way that trades off size for frequency, achieving coarse-grained optimality. For instance, shown in FIG. 4 is a typical mixed format layout, 401, and a second and possibly larger dictionary, 402, of size m2, which can be indexed via an additional pointer, $F_{k+1}$ of size s'(along with another discriminating bit) stored in the field value position (in the record) pointed to by the offset element, $O_1$. In this case field value, $F_{k+1}$ is being used as a pointer to the dictionary since the size of the offset element, $O_1$ is not large enough for a larger dictionary. The larger pointer size is compensated by the lower frequency of the entries in the over flow dictionary. Therefore, note that the variable size of the field value slot permits more optimal coding of the dictionary value depending on its frequency and size.

Figure 5:
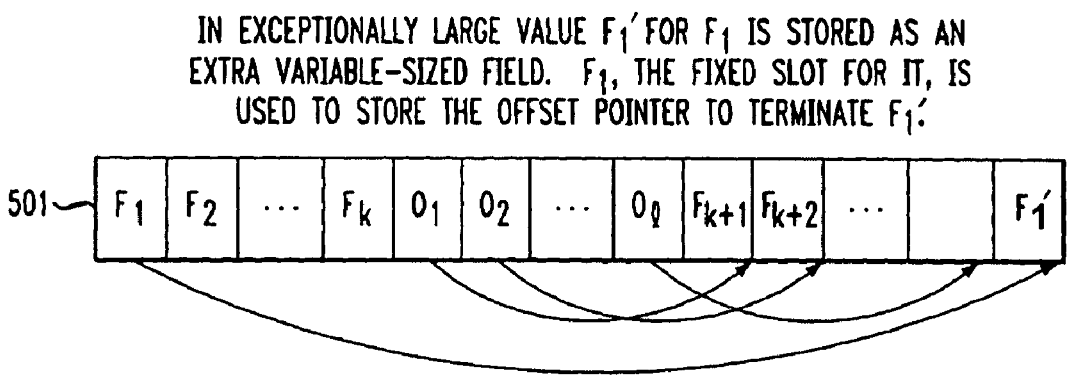
FIG. 5 illustrates a physical layout for compressing a fixed-sized field with exception (overflows).

Next, we take a look at a variant interpretation of the fixed-sized field itself, as illustrated in FIG. 5. FIG. 5 shows a typical mixed format layout, 501, in which fixed-sized fields are overloaded to store field values, field offsets, or pointers into compression dictionaries. A fixed-sized field of uniform and small size is often not worth compressing, because the additional bits needed to code a variable field resulting from that might erase the gain of compression. However, sometimes there are fixed-sized fields that can use a smaller size except for a small fraction of large values. In this case, allowing exceptions to the fixed-sized format can achieve compression. An exception value for a fixed-sized field can be coded as an offset (stored in the fixed-sized slot), that points to an additional variable-sized field towards the end of the record. For example, as shown in FIG. 5, an exceptionally large value $F_1'$ for a fixed-sized field $F_1$ is stored as an extra variable-sized field. The fixed slot for $F_1$ is used to store the offset pointer to terminate $F_1'$.

Figure 6:
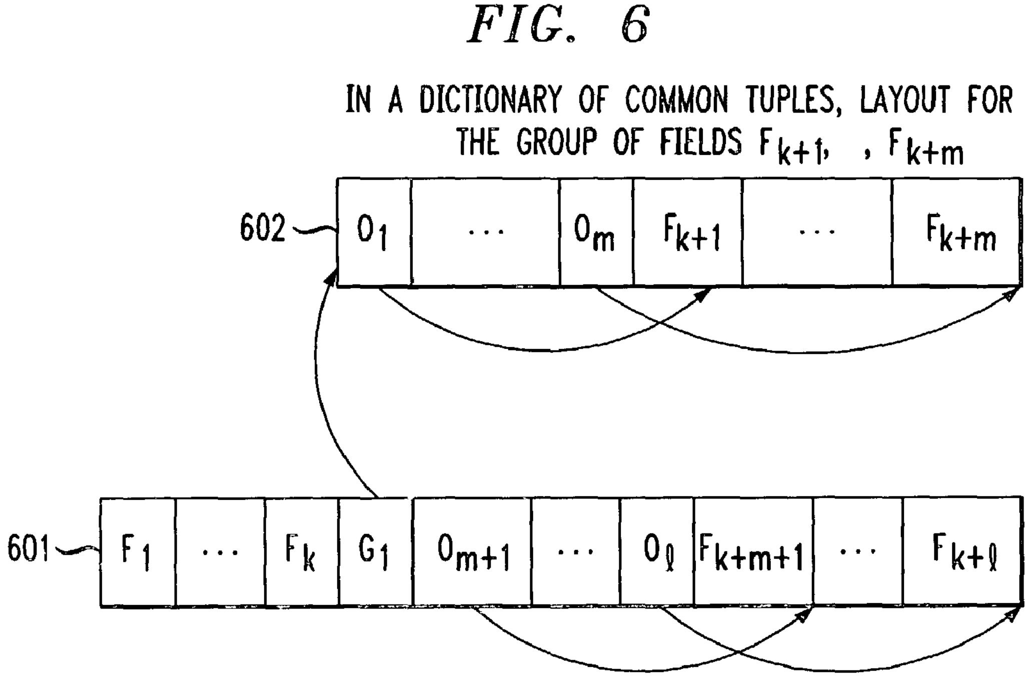
FIG. 6 shows a physical layout for compressing a group of correlated fields.

FIG. 6 shows a physical layout for compressing a group of correlated fields. An example of a group of correlated fields may be many employees belonging to the same department (field) or having the same job title (field). A mixed format layout, 601, of a group of fields is displayed in FIG. 6. When a group of fields (columns) are correlated, it is better to compress them together. In this case, a single offset slot is used for the group. For a frequent tuple value for the group that is stored in a dictionary 602, the offset slot, $G_1$ points to that dictionary entry as shown in FIG. 6. The dictionary entries are themselves records layed out in the mixed format and are compressible. For less frequently occurring tuple values, the offset slot, for example, $O_{m+1}$, as shown in FIG. 6, will point into the record for the tuple, which will have its own offsets and so on. Note that, this group of fields is treated as a record with its own physical layout, whether an instance is stored in the dictionary or in the containing record. The variant treatment of the offset element, including the refinement on sizing and cascading pointers, for the entire group is very similar to that for a single variable-sized field.

Figure 7:
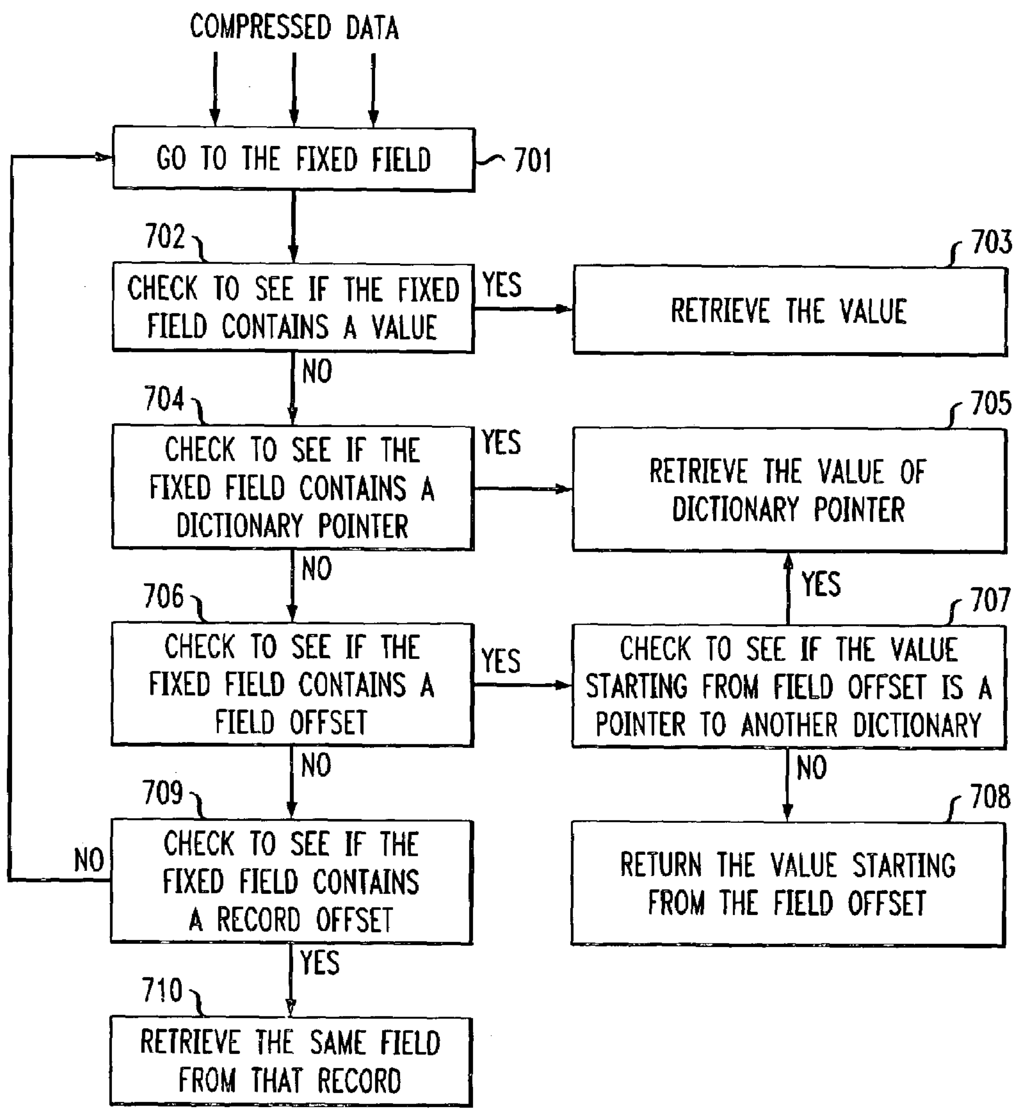
FIG. 7 is a flow chart illustrating a method for decompressing a field.

Traditional methods of compression would require the decompression of an entire block or more of data in order to get at a single record or field. Decompression of requested fields in this invention can be achieved without decompressing or scanning even the entire record. An efficient and fast method of retrieving the compressed data is shown in FIG. 7, ignoring the details associated with using multiple dictionaries per field. FIG. 7 is a flowchart illustrating a method for decompressing a simple field, not belonging to a group in a record. At step 701, the fixed field is located, which is an offset given in data dictionary. At step 702, the fixed field is checked to see if it contains a value. If the fixed field contains a value, the value is retrieved at step 703. If the fixed field does not contain a value, a check is made to see if it contains a dictionary pointer at step 704. If the fixed field contains a dictionary pointer, the value of the dictionary entry is retrieved at step 705. If the fixed field does not contain either a value or a dictionary pointer, then a check is made to see if the fixed field contains a field offset at step 706. If the fixed field contains a field offset, a check is made to see if the value starting from the offset is a pointer to another dictionary at step 707. If so, then the value of the dictionary entry is once again retrieved at step 705. However, if it is determined at step 707 that the value starting from the offset is not a pointer to another dictionary, then that value is retrieved at step 708. If the fixed field does not contain either a value, or a dictionary pointer or a field offset, then a check is made to see if the fixed field contains a record offset at step 709. If it contains a record offset, retrieve the same field from that record at step 710.

In order to decompress a field belonging to a group of fields, the offset element for the group given in data dictionary is located. It must contain either a pointer to a dictionary entry, another record, or an offset into the current record. In each case, there will be a tuple for the group. Then the field value is decompressed from the given tuple using the steps 702 to 710 in FIG. 7 for simple fields within-group offsets given in the data dictionary.

In the above discussion, it was assumed that static dictionaries were utilized for concreteness. The same ideas can be applied with a moving-window type of dictionary. In this case, the offset slot in the field rather than pointing to entries in a static dictionary, simply points to another record, hopefully in the same block. When column-wise repetitions are clustered, this type of dictionary can be more effective. Also, because of compression, only small dictionaries of common values are used, hence the I/O cost of reading them is amortized over large number of records. In the case where sliding-window type of dictionaries are used, access to dictionary entries share block I/O with the record to be decompressed with high probability.

Compression, in general, normally complicates updating the data further.

However, the compression method disclosed in this invention, rather, simplifies it a little further. For one, fields that require frequent updates can be stored in a fixed-sized in the physical layout. Typically, it is the numerical fields for example, numbers, prices and balances etc. that get the most updates. When a compressed field is being updated, there is the option of searching for the new value in the dictionary, thereby maintaining compression, or to simply store the new value directly. In the former case, there is no change to the record size, hence no need for shifting the records in the dictionary. In general, tables, or portions of tables that are updated frequently do not need compression. Various applications such as OLTP needs fast updates to current state; DSS and data mining require fast access to historical archives. Hence, the compression method in this invention reduces the tension between compression and fast access.

While the invention has been described in relation to the preferred embodiments with several examples, it will be understood by those skilled in the art that various changes may be made without deviating from the spirit and scope of the invention as defined in the appended claims.

What is claimed is:

1. A method for improving compression of data, comprising:

arranging the data on a mixed format physical layout having a plurality of fixed-sized fields, a plurality of variable-sized fields and a plurality of offset slots, the fixed-sized fields being of a first size and the offset slots being of a second size;

dividing the data on the mixed format physical layout into the fixed-sized fields and the variable sized fields; and compressing the data of the variable sized fields and the fixed-sized fields.

2. The method defined in of claim 1, further comprising:

storing sizes of the fixed-sized fields in a data dictionary;

storing frequency of the data in the fixed-sized fields and the variable-sized fields in the data dictionary; and storing information common to all records in the fixed-sized fields and the variable sized fields in the data dictionary.

3. The method of claim 1, wherein at least one of the fixed-sized fields comprises a field value.

4. The method defined in of claim 1, wherein at least one of the fixed-sized fields comprise of comprises a field offset.

5. The method of claim 1, wherein at least one of the fixed-sized fields comprises a pointer into a data dictionary.

6. The method of claim 3, further comprising:

storing a value of the at least one of the fixed-sized fields in an additional variable-sized field;

coding the value of the at least one of the fixed-sized fields as a field offset pointing to the additional variable-sized field.

7. The method of claim 3, further comprising:

storing frequently occurring long values of the fields in a data dictionary;

coding a value of one of the variable-sized fields as a field offset by pointing to one of the frequently occurring long values of the fields in the data dictionary.

8. The method claim 1, further comprising:

coding a value of one of the variable-sized fields by encoding a field offset into one of the offset slots.

9. The method of claim 5, further comprising: storing frequently occurring long values of the fields in a second data dictionary, wherein the second data dictionary is larger than the data dictionary; and coding a value of one of the variable-sized fields as a field value pointing into the second data dictionary.

10. A method for improving compression of data, comprising:

arranging the data on a mixed format layout having a plurality of fixed-sized fields, a plurality of variable-sized fields and a plurality of offset slots, the fixed-sized fields being of a first size and the offset slots being of a second size, wherein the data comprises a group of correlated fields;

dividing the data on the mixed format physical layout into the fixed-sized fields and the variable-sized fields; and compressing the data of the variable-sized fields and the fixed-sized fields.

11. The method of claim 10, further comprising:

storing sizes of the fixed-sized fields in a data dictionary;

storing frequency of the data in the fixed-sized fields and the variable sized fields in the data dictionary;

storing information common to all records in the fixed-sized fields and the variable sized fields in the data dictionary.

12. The method of claim 10, wherein at least one of the fixed-sized fields comprises a field value.

13. The method defined in claim 10, wherein at least one of the fixed-sized fields of comprises a field offset.

14. The method defined in claim 10, wherein at least one of the fixed-sized fields comprises a pointer into a data dictionary.

15. The method of claim 12, further comprising:

storing frequently occurring values for the group of correlated fields in a data dictionary; and coding a frequently occurring value for the group by pointing a field offset, belonging to the group, to the data dictionary.

16. The method of claim 12, further comprising:

coding an infrequently occurring value for the group, by pointing a field offset, belonging to the group, to a field in a record.

17. A method for retrieving compressed data, comprising:

receiving a request for decompressing the compressed data;

receiving the compressed data on a mixed format physical layout responsive to the request, wherein the mixed format physical layout comprises a plurality of fixed-sized fields, a plurality of variable-sized fields and a plurality of offset slots, the fixed-sized fields being of a first size and the offset slots being of a second size;

searching for a value in the fixed-sized fields; retrieving the value in the fixed-sized fields corresponding to the received compressed data.

18. The method of claim 17, wherein the retrieving step further comprises:

retrieving a dictionary entry if the value in the fixed-sized fields comprises a dictionary pointer;

retrieving a value starting from a field offset if the value of the fixed field fixed-sized fields comprises a field offset; and retrieving a same field from a record, if the value of the fixed-sized fields comprises a record offset.

19. An apparatus for improving compression of data, comprising:

means for arranging the data on a mixed format physical layout having a plurality of fixed-sized fields, a plurality of variable-sized fields and a plurality of offset slots, the fixed-sized fields being of a first size and the offset slots being of a second size;

means for dividing the data on the mixed format physical layout into the fixed-sized fields and the variable sized fields; and means for compressing the data of the variable sized fields and the fixed-sized fields.

20. An apparatus for retrieving compressed data, comprising:

means for receiving a request for decompressing the compressed data;

means for receiving the compressed data on a mixed format physical layout responsive to the request, wherein the mixed format physical layout comprises a plurality of fixed-sized fields, a plurality of variable-sized fields and a plurality of offset slots, the fixed-sized fields being of a first size and the offset slots being of a second size;

searching for a value in the fixed fields;

means for retrieving the value in the fixed fields corresponding to the received compressed data.

21. A compressible computer medium, comprising a plurality of instructions to cause a computer to perform the steps of:

arranging data on a mixed format physical layout having a plurality of fixed-sized fields, a plurality of variable-sized fields and a plurality of offset slots, the fixed-sized fields being of a first size and the offset slots being of a second size;

dividing the data on a mixed format physical layout into the fixed-sized fields and the variable sized fields; and compressing the data of the variable sized fields and the fixed-sized fields.

22. The compressible computer medium according to claim 21, wherein the instructions further cause the computer to perform the steps of:

storing sizes of the fixed-sized fields in a data dictionary;

storing frequency of the data in the fixed-sized fields and the variable-sized fields in the data dictionary;

storing information common to all records in the fixed-sized fields and the variable sized fields in the data dictionary.

23. The compressible computer medium of claim 21, wherein at least one of the fixed-sized fields comprises a field value.

24. The compressible computer medium of claim 21, wherein at least one of the fixed-sized fields comprises a field offset.

25. The compressible computer medium of claim 22, wherein at least one of the fixed-sized fields comprises a pointer into the data dictionary.

26. The compressible computer medium according to claim 23, wherein the instructions further cause the computer to perform the steps of:

storing a value of the at least one of the fixed-sized fields in an additional variable-sized field;

coding the value of the at least one of the fixed-sized fields as a field offset pointing to the additional variable-sized field.

27. The compressible computer medium according to claim 22, wherein the instructions further cause the computer to perform the steps of:

storing frequently occurring long values of the fields in the data dictionary;

coding a value of one of the variable-sized fields as a field offset pointing into the data dictionary.

28. The compressible computer medium according to claim 25, wherein the instructions further cause the computer to perform the steps of:

coding a value of one of the variable-sized fields by encoding a field offset into a record.

29. The compressible computer medium according to claim 22, wherein the instructions further cause the computer to perform the steps of:

storing frequently occurring long values of the fields in a second data dictionary, wherein the second data dictionary is larger than the data dictionary;

coding a value of one of the variable-sized fields as field value pointing into the second data dictionary.

* * * * *